(12) United States Patent
Hwang et al.

(10) Patent No.: US 6,769,629 B2
(45) Date of Patent: Aug. 3, 2004

(54) GAS INJECTOR ADAPTED FOR ALD PROCESS

(75) Inventors: Chul Ju Hwang, Kwangju-shi (KR); Jong Man Park, Seoul (KR)

(73) Assignee: Jusung Engineering Co., Ltd., Kyunggio-Do (KR)

( * ) Notice: Subject to any disclaimer, the term of this patent is extended or adjusted under 35 U.S.C. 154(b) by 0 days.

(21) Appl. No.: 10/326,745

(22) Filed: Dec. 20, 2002

(65) Prior Publication Data

US 2003/0116652 A1 Jun. 26, 2003

(30) Foreign Application Priority Data

Dec. 26, 2001 (KR) .......................................... 2001-85118

(51) Int. Cl.[7] .............................. B05B 3/10; B05B 1/00; B05B 1/32; A01G 27/00; C23C 16/00
(52) U.S. Cl. .......................... 239/224; 239/70; 239/596; 239/533.14; 239/457; 118/715
(58) Field of Search ........................... 239/222.13, 244, 239/436, 437, 451, 457, 533.14, 596, 67, 69, 70; 118/715

(56) References Cited

U.S. PATENT DOCUMENTS

| 1,739,787 A | * | 12/1929 | Doughty et al. | ....... 137/119.06 |
| 3,664,585 A | * | 5/1972 | Curtis | ................... 239/222.21 |
| 5,226,331 A | * | 7/1993 | Thompson et al. | ........ 73/865.9 |
| 5,453,124 A | | 9/1995 | Moslehi et al. | ............. 118/715 |
| 5,783,023 A | | 7/1998 | Oh et al. | ..................... 156/345 |
| 6,656,284 B1 | * | 12/2003 | Hwang et al. | .............. 118/715 |

* cited by examiner

Primary Examiner—William C. Doerrler
(74) Attorney, Agent, or Firm—Marger Johnson & McCollom P.C.

(57) ABSTRACT

A gas injector includes a body, a motor and a chopper. The body is mounted on a reaction chamber in a vertically extending cylinder shape and has a plurality of gas injection tubes and a central hollow portion. The plurality of gas injection tubes pass through a bottom face of the body and the central hollow portion passes through each center of the bottom and top faces of the body. The motor has a rotary shaft inserted into the central hollow portion. The chopper is formed in a circular-plate shape and has a notch on a predetermined portion. The chopper is coupled with an end of the rotary shaft and rotated by a rotation of the rotary shaft in a state that the bottom face of the body is closely attached to the chopper through a magnetic sealing.

4 Claims, 5 Drawing Sheets

GAS INJECTOR ADAPTED FOR ALD PROCESS

BACKGROUND OF THE INVENTION

1. Field of the Invention

The present invention relates to a gas injector, and more particularly, to a gas injector adapted for an ALD process.

2. Description of the Related Art

Recently, with high integration of semiconductor devices, semiconductor devices have been downsized and thus vertical dimension thereof has been also downsized. Gate insulating layer and capacitor dielectric layer of dynamic random access memory (DRAM) are representative elements showing such the downsizing. In addition, in a semiconductor device whose design rule is 0.13 µm or less, many attempts to substitute a new material for a conventional material have been made in order to meet requirements for new electrical properties. For example, instead of ONO dielectric layer as a capacitor dielectric layer, a multi-component high dielectric film such as BST or PZT has been widely researched.

To successfully form these new thin films at a very thin thickness of approximately 100 Å, however, there is a need of a novel thin film forming method that is different from the conventional metal-organic chemical vapor deposition (MOCVD) method. For this need, atomic layer deposition (ALD) technology is widely used to form a thin film of the semiconductor device.

Unlike a typical chemical vapor deposition (CVD) method for depositing a thin film by simultaneously supplying component materials of the thin film, the ALD method is a technique for depositing a thin film in a unit of an atomic layer by repeatedly supplying the component materials on a substrate in turns. According to the ALD method, the thin film can be formed only by a chemical reaction of a surface of the substrate. Therefore, regardless of unevenness of the surface of the substrate, it is possible to form a thin film having a uniform thickness. Further, since a deposition thickness of the thin film is proportional not to a deposition time but to a material supplying period, it is also possible to precisely adjust the thickness of the thin film.

FIG. 1 is a schematic view of a conventional ALD apparatus. Referring to FIG. 1, a gas injector 20 is mounted on a reaction chamber 10 and various kinds of gases are supplied through a plurality of gas supply pipes 30 to the gas injector 20. A plurality of bombes (not shown) are mounted on the gas cabinet 70 and the gas supply pipes 30 are independently coupled with respective gas bombes.

Supply valves 30b provided with typical valves are mounted on a predetermined portion of the gas supply pipes 30 near the bombes. ALD valves 30a that are designed to be adaptable to the ALD process and capable of being closed/opened at a high speed are mounted near the gas injector. By-pass pipes 40 are mounted on gas supply pipes 70 that are mounted between the supply valves 30b and the ALD valves 30a. Also, ALD valves 40 are mounted on the by-pass pipes 40. An ALD PLC 50 and an ordinary PLC 60 control the ALD valves 30a and 40a and the supply valves 30b, respectively.

In case of the ALD process, a thickness of the thin film deposited at each cycle must be 0.1 Å to 1 Å. Therefore, to form a thin film of 500 Å thick, a gas supply cycle must be 500 times to 5,000 times. Accordingly, if a thin film of approximately 500 Å is to be deposited on 100 wafers using the ALD process, the gas supply cycle must be 50,000 times to 500,000 times. This means that the ALD valves 30a mounted on the gas supply pipes must be turned on/off as often as 50,000 times to 500,000 times. In that case, however, a lifetime of a typical ALD value is terminated. Therefore, even when 100 wafers are used, it is necessary to repair the ALD apparatus, including a replacement of the ALD valves. Due to the frequent equipment repair, the yield as well as the reliability of the semiconductor device may be degraded. Further, there is a disadvantage that the expensive ALD PLC 50 should be used.

SUMMARY OF THE INVENTION

Therefore, the present invention has been devised to solve the above problems, and it is an object of the present invention to provide a gas injector, which is adapted for an ALD process without using any ALD valve.

To achieve the aforementioned object of the present invention, there is provided a gas injector. The injector includes: a body mounted on a reaction chamber in a vertically extending cylinder shape, and having a plurality of gas injection tubes penetrating bottom face thereof and a central tube penetrating each center of the bottom and top faces of the body; a motor having a rotary shaft inserted into the central tube; and a circular-plate shaped chopper connected to an end of the rotary shaft and having a predetermined cut portion, the chopper being magnetically sealed with the bottom face of the body by the rotation of the rotary shaft and rotating in a sealed state.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
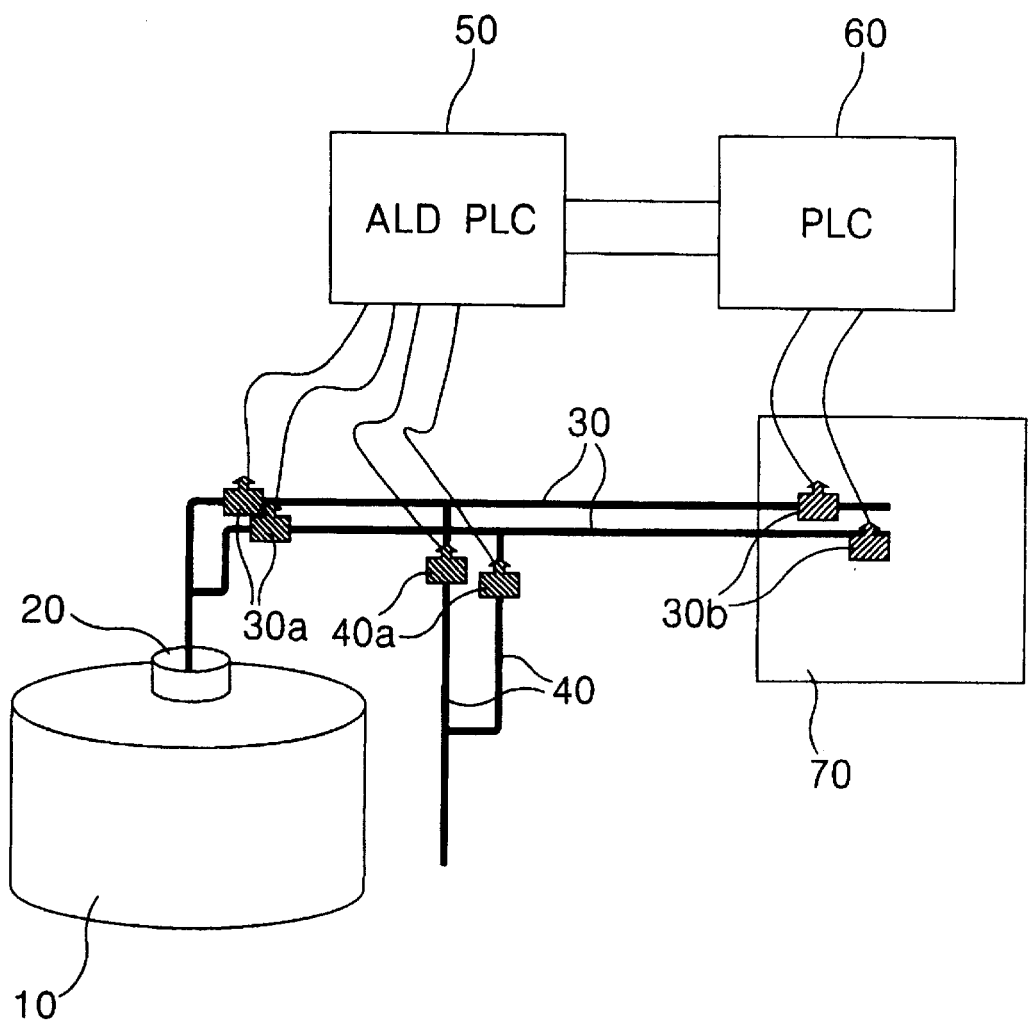
FIG. 1 is a schematic view of a conventional ALD apparatus.

Now, preferred embodiments of the present invention will be described in detail with reference to the annexed drawings.

FIGS. 2a to 2d are views explaining a gas injector in accordance with an embodiment of the present invention. Referring to FIGS. 2a to 2d, a gas injector installed on a reaction chamber 110 is largely divided into three parts, i.e., a body 122, a motor 180 and a chopper 124.

The body 122 is mounted on the reaction chamber 110 in a vertically extending cylinder shape. The body 122 has a central tube 122b penetrating the bottom and upper faces of the body and a plurality of gas injection tubes 122a formed at the bottom face of the body around the central tube 122b and penetrating the bottom face of the body.

A plurality of gas supply pipes 130 are connected with a gas cabinet 170 and the gas injection tubes 122a are connected with the gas supply pipes 130. Gas supply valves 130a and 130b having the construction of a typical valve are installed at both ends of the gas supply pipes 130, e.g., at the gas cabinet side and the injector body side. The gas supply valves 130a and 130b are controlled by a PLC 160.

Figure 2A:
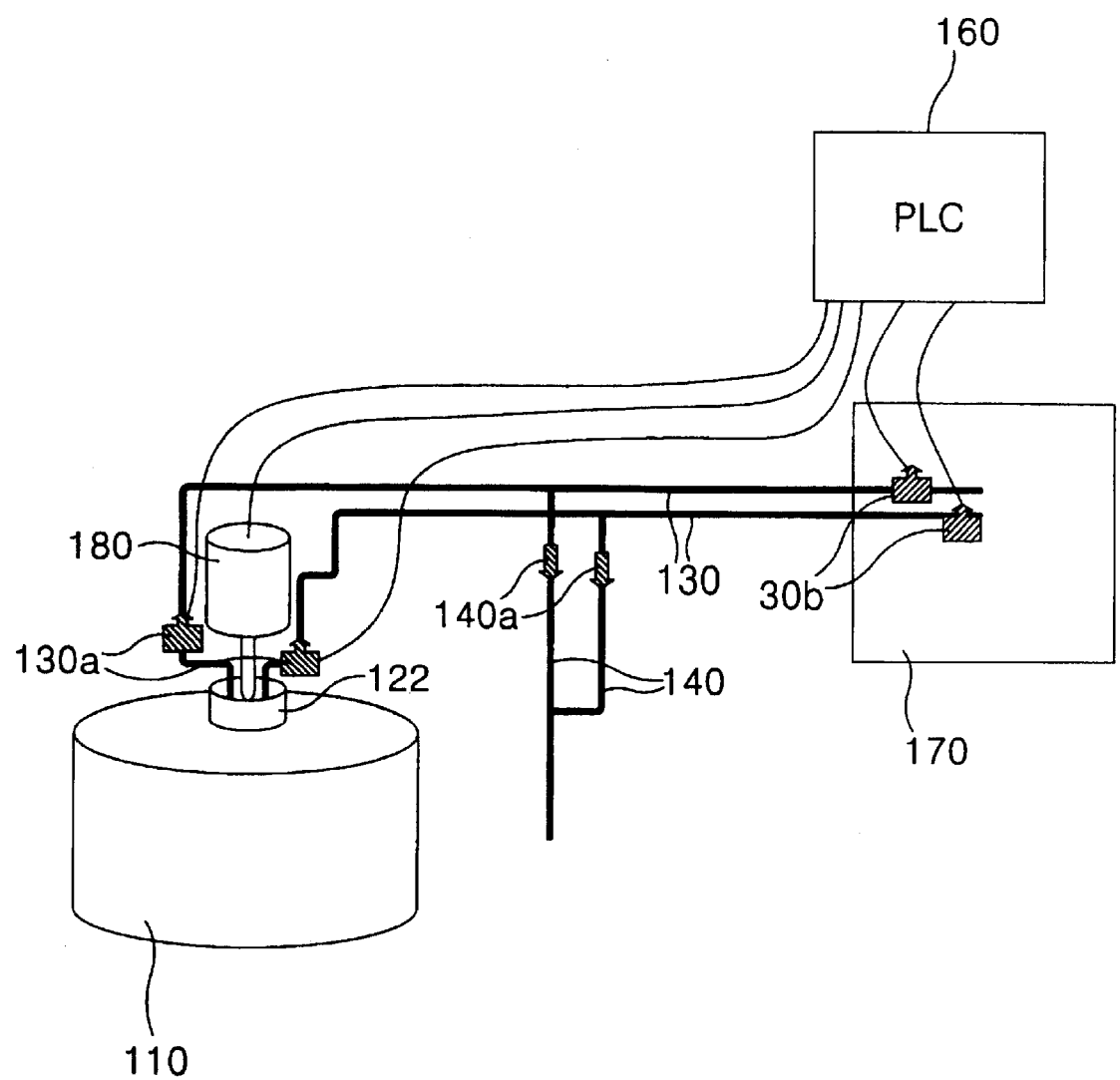
FIGS. 2a to 2d are views explaining a gas injector in accordance with an embodiment of the present invention.
Figure 2B:
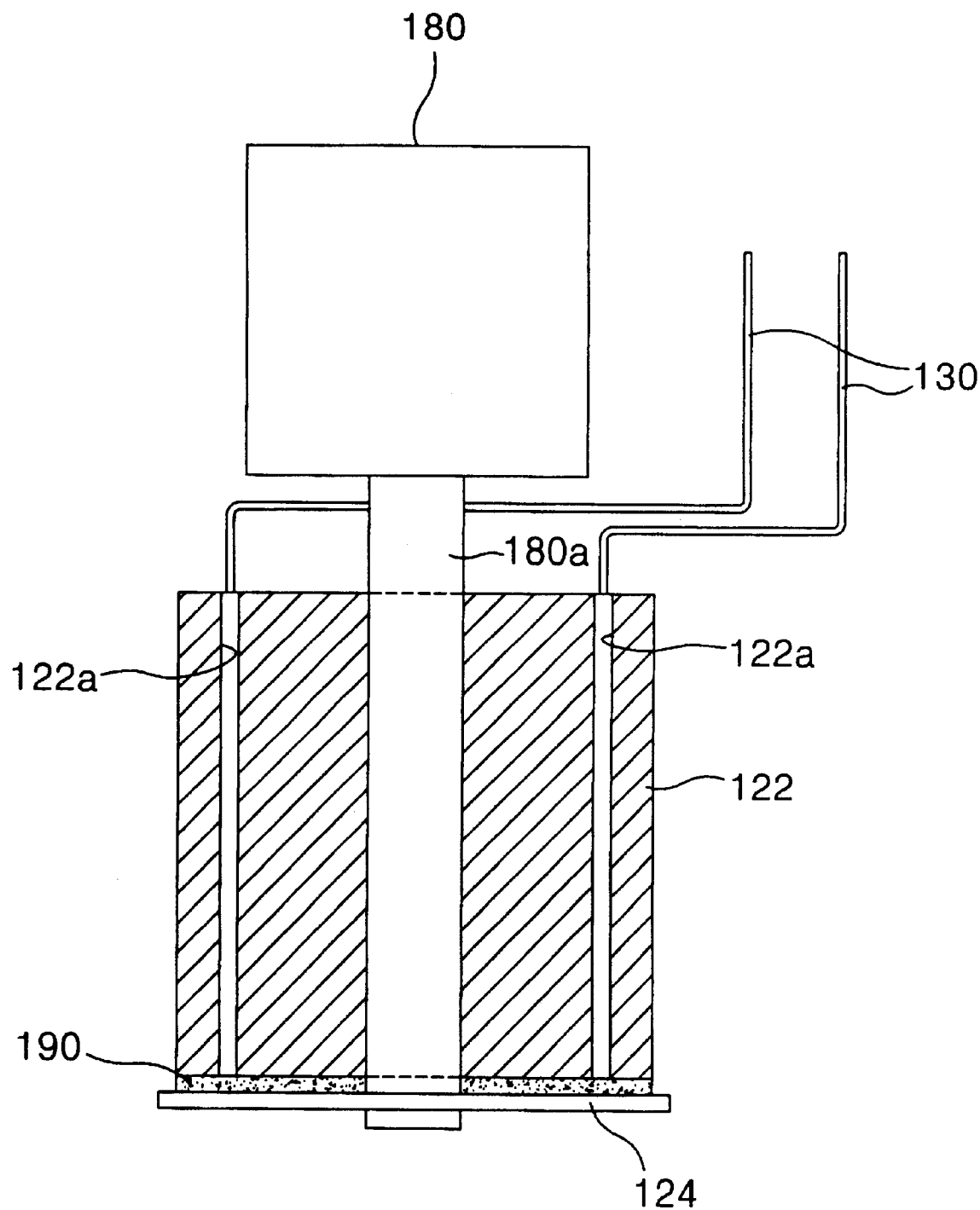
Figure 2C:
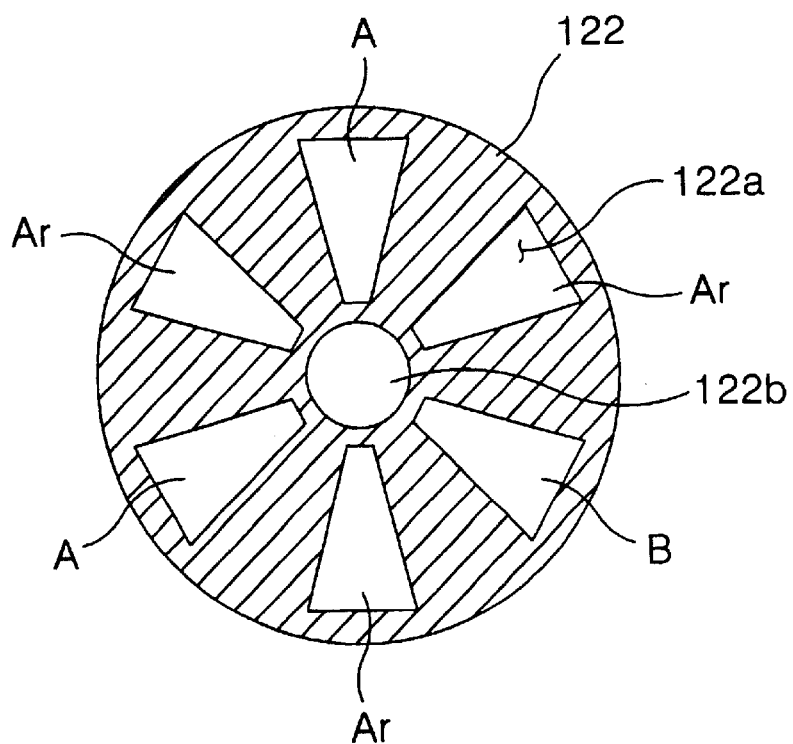
Figure 2C:
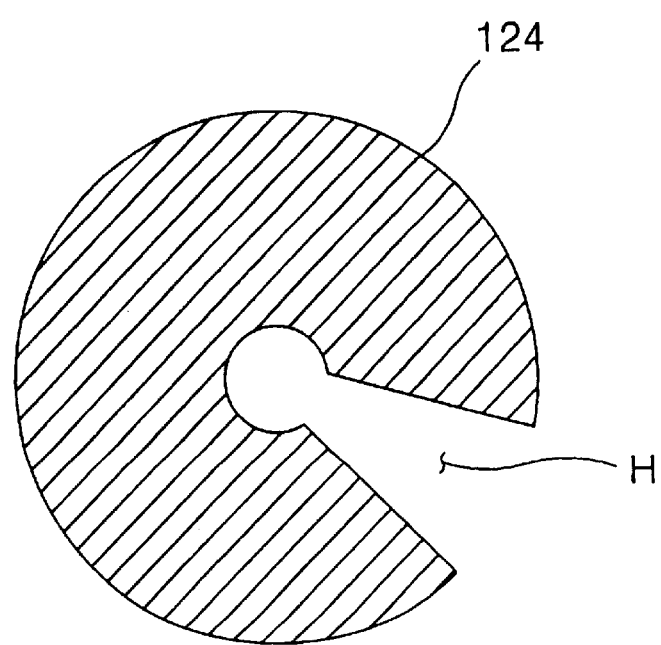

The motor 180 is installed over the body 122. A rotary shaft 180a is inserted into the central tube 122b. The chopper 124 is installed at an end of the rotary shaft 180a and rotated together with the rotary shaft 180a during the rotation of the rotary shaft 180a. As shown in FIG. 2c, the chopper 124 is a circular-plate shape with a cutaway portion H of a notch type.

In a state that gases are being supplied through the gas supply pipes 130 to the gas injection tubes 122a, if the chopper 124 is rotated at a constant speed by the motor 180, only the gas injection tube corresponding to the cutaway portion H is opened, so that gas is supplied into the reaction chamber 110 at a constant period. A magnetic sealing 190 is provided between the bottom face of the body 122 and the chopper 124. The magnetic sealing 190 is continuously maintained even while the chopper 124 is rotated.

According to the present invention, since the gas is periodically injected into the reaction chamber 110 by the rotation of the chopper 124 in a state that a constant gas flow is continuously supplied through the gas supply pipes 130, the ALD valves 30a and 40a and the ALD PLC 50 (referring to FIG. 1) of the prior art are not needed.

Since the bottom face of the body 122 is closely in contact with the chopper 124 by the magnetic sealing 190, the gas pressure of the gas supply pipe 130 that is not opened by non-corresponding to the cutaway portion is increased.

To prepare for the circumstance, check valves 140a made in the typical valves are installed on by-pass pipes 140, and the by-pass pipes 140 are connected with the gas supply pipes 130. The by-pass pipes 140 can be also used to stabilize the gas flow supplied into the reaction chamber 110 at the early stage of the process.

FIG. 2c is a view showing a body 122 having six gas injection tubes 122a, and a folding-fan shaped chopper 124. As shown in FIG. 2c, it is desirable that the injection holes 122a be circularly arranged along a circumference of the bottom face of the body 122. A reference symbol H represents the cutaway portion.

An 'A' gas, 'Ar' gas, a 'B' gas, 'Ar' gas, an 'A' gas and 'Ar' gas are sequentially injected through the six gas injection tubes 122a at a constant gas flow in a clockwise direction. While the chopper 124 is being rotated in a clockwise direction at a constant speed, whenever the chopper 124 is rotated once, the gas is injected in the following order of the A gas, the Ar gas for purge, the B gas, the Ar gas for purge, the A gas, and the Ar gas for purge, while maintaining a ratio of the A gas to the B gas at 2:1. At this time, it is first assumed that the respective gas injection tubes 122a have the same injection size.

For the above process, there are provided three gas supply pipes 130 for independently supplying the A gas, the Ar gas for purge and the B gas. It is allowed that the two gas injection tubes 122a for injecting the A gas share one A gas supply pipe 130 with each other, and the three gas injection tubes 122a for injecting the Ar gas share one Ar gas supply pipe 130 with one another.

Figure 2D:
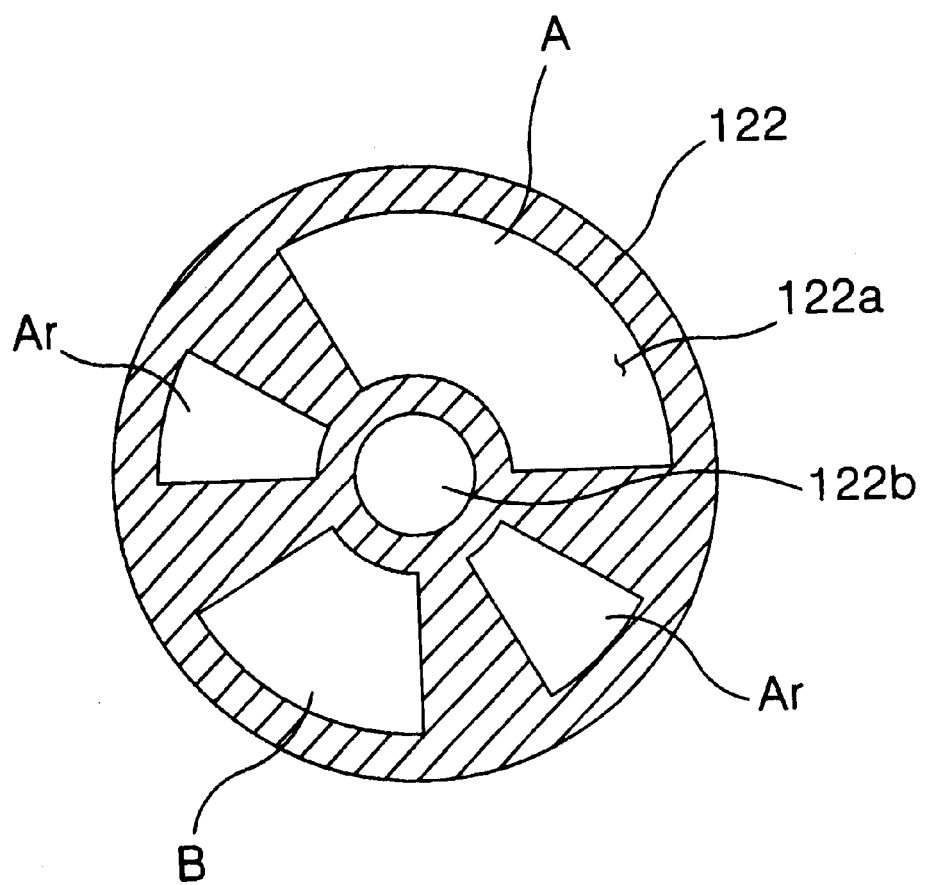

According to another embodiment, as shown in FIG. 2d, the different gas supply ratio can be implemented by differently making the gas injection tubes 122a in size. In other words, the size of the A gas injection tube is made two times as large as that of the B gas injection tube.

As described above, since the present invention periodically supplies several gases in turns using the chopper 124, the ALD valves 30a and 40a and the ALD PLC 50 (referring to FIG. 1) of the conventional art are not needed. Accordingly, frequent equipment repairs such as a replacement of the ALD valves 30a and 40a are not needed and it is unnecessary to use the expensive ALD PLC 50 which was applied to the conventional art. Particularly, it is possible to easily adjust a supply ratio of the gas by adjusting an arrangement of the gas supplied through the gas injection tubes 122a.

While the present invention has been described in detail, it should be understood that various changes, substitutions and alterations could be made hereto without departing from the spirit and scope of the invention as defined by the appended claims.

What is claimed is:

1. A gas injector comprising:
   a body mounted on a reaction chamber in a vertically extending cylinder shape, and having a plurality of gas injection tubes penetrating bottom face thereof and a central tube penetrating each center of the bottom and top faces of the body;
   a motor having a rotary shaft inserted into the central tube; and
   a circular-plate shaped chopper connected to an end of the rotary shaft and having a predetermined cut portion, the chopper being magnetically sealed with the bottom face of the body and rotating by the rotation of the rotary shaft in a sealed state.

2. The gas injector of claim 1, wherein the plurality of gas injection tubes are circularly arranged along a circumference of the bottom face of the body.

3. The gas injector of claim 1, wherein at least one of the gas injection tubes is different in size from the others.

4. The gas injector of claim 1, wherein the chopper is formed in a folding-fan shape.

* * * * *